US010571893B2

(12) United States Patent
Halperin et al.

(10) Patent No.: US 10,571,893 B2
(45) Date of Patent: Feb. 25, 2020

(54) ORIENTATION OPTIMIZATION IN 3D PRINTING

(71) Applicant: ASSEMBRIX LTD., Petach Tikva (IL)

(72) Inventors: Dan Halperin, Tel Aviv (IL); Eric Berberich, Tel Aviv (IL)

(73) Assignee: ASSEMBRIX LTD., Petach Tikva (IL)

(*) Notice: Subject to any disclaimer, the term of this patent is extended or adjusted under 35 U.S.C. 154(b) by 154 days.

(21) Appl. No.: 15/532,106

(22) PCT Filed: Aug. 3, 2015

(86) PCT No.: PCT/IL2015/050797
§ 371 (c)(1),
(2) Date: Jun. 1, 2017

(87) PCT Pub. No.: WO2016/088118
PCT Pub. Date: Jun. 9, 2016

(65) Prior Publication Data
US 2017/0269575 A1    Sep. 21, 2017

Related U.S. Application Data

(60) Provisional application No. 62/087,262, filed on Dec. 4, 2014.

(51) Int. Cl.
*G06F 17/10* (2006.01)
*G05B 19/4099* (2006.01)
(Continued)

(52) U.S. Cl.
CPC ........ *G05B 19/4099* (2013.01); *B29C 64/386* (2017.08); *B33Y 50/00* (2014.12); *G06F 17/50* (2013.01); *G05B 2219/49023* (2013.01)

(58) Field of Classification Search
CPC ..... G06F 17/50; G05B 19/4099; B33Y 50/00; B29C 64/386
(Continued)

(56) References Cited

U.S. PATENT DOCUMENTS

| 2005/0122346 A1 | 6/2005 | Horn |
| 2005/6980934 | 12/2005 | Sadovnik |
| 2007/0233298 A1 | 10/2007 | Heide et al. |
| 2012/0242007 A1 | 9/2012 | Coeck |

(Continued)

FOREIGN PATENT DOCUMENTS

| WO | WO 2014/141273 | 9/2014 |
| WO | WO 2016/088118 | 6/2016 |

OTHER PUBLICATIONS

International Search Report of PCT Application No. PCT/IL2015/050797 dated Dec. 2, 2015.
(Continued)

*Primary Examiner* — Andre Pierre Louis
(74) *Attorney, Agent, or Firm* — Pearl Cohen Zedek Latzer Baratz LLP

(57) ABSTRACT

Systems and methods are provided, in which an input module receives a model file, configuration(s) and cost parameters, and a processing unit selects and updates orientation sets for the model, and calculates the received cost parameters for pairs of orientation and configuration. Systems and methods further calculate for each orientation, a cost function value by weighting the calculated cost parameters according to the configuration(s) and display the calculated cost function values for the orientations on a respective sphere in a user interface. The sphere may be colored according to the cost function values, the orientation set may be enhanced and costs may be recalculated according to the cost function, and various information and statistics may be presented on the sphere. Finally, a selected orientation may be used to define the printing configuration and parameters and be used to provide a 3DP file.

10 Claims, 5 Drawing Sheets

(51) Int. Cl.
*B33Y 50/00* (2015.01)
*G06F 17/50* (2006.01)
*B29C 64/386* (2017.01)

(58) Field of Classification Search
USPC .......................................................... 703/2
See application file for complete search history.

(56) References Cited

U.S. PATENT DOCUMENTS

| | | | |
|---|---|---|---|
| 2014/0052415 | A1 | 2/2014 | Baran et al. |
| 2014/0177008 | A1 | 6/2014 | Raymond et al. |
| 2014/0319716 | A1 | 10/2014 | Shtilerman |
| 2014/0350898 | A1 | 11/2014 | Tschanz et al. |
| 2015/0057784 | A1 | 2/2015 | Butler et al. |
| 2015/0321427 | A1* | 11/2015 | Gunnarsson ........... B33Y 50/00 700/98 |
| 2016/0311165 | A1 | 10/2016 | Mark et al. |
| 2017/0173889 | A1 | 6/2017 | Thomas-Lepore et al. |
| 2017/0239719 | A1 | 8/2017 | Buller et al. |
| 2017/0269575 | A1 | 9/2017 | Halperin et al. |
| 2018/0165730 | A1 | 6/2018 | Norman |
| 2019/0009472 | A1 | 1/2019 | Mark |

OTHER PUBLICATIONS

Bugdayci et al., "Analysis of Slicing-Tools for Fused Deposition Modeling 3D-Printers and comparison of different printers", Fachstudie Nr. 191, University of Stuttgart, Jul. 15, 2014.

Paul Alexander ,Seth Allen Debasish Dutta "Part orientation and build cost determination in layered manufacturing" vol. 30, Issue 5, Apr. 1998, pp. 343-356.

Nobuyuki Umetani and Ryan Schmidt "Cross-sectional structural analysis for 3D printing optimization" SA '13 SIGGRAPH Asia 2013 Technical Briefs.

Sertac Karaman and Emilio Frazzoli "Sampling-based algorithms for optimal motion planning" vol. 30 issue: 7, pp. 846-894, published online: Jun. 22, 2011.

J.J. Kuffner_and S.M. Lavalle "RRT-connect: An efficient approach to single-query path planning" In Proc. 2000 IEEE Int'l Conf. on Robotics and Automation (ICRA 2000), pp. 995-1001, Jan. 2000.

Ralf Heckmann and Thomas Lengauer "A simulated annealing approach to the nesting problem in the textile manufacturing industry", vol. 57, Issue 1, pp. 103-133, Dec. 1995.

Chen, et al., "Dapper: Decompose-and-Pack for 3D Printing", ACM Trans. Graph., Nov. 1, 2015; 34(6):213-1, (Year: 2015).

Gomez, et al., "View/state planning for three-dimensional object reconstruction under uncertainty", Autonomous Robots, Dec. 23, 2015, 41-1, pp. 89-109.

Kondo, "Motion Planning with Six Degrees of Freedom by Multistrategic Bidirectional Heuristic Free-Space Enumeration", IEEE Transactions on Robotics and Automation, Jun. 1991, vol. 7, No. 3, pp. 267-277.

Non-final office action of U.S. Appl. No. 15/214,488, dated Jul. 25, 2018.

Final office action of U.S. Appl. No. 15/214,488, dated Jan. 25, 2019.

* cited by examiner

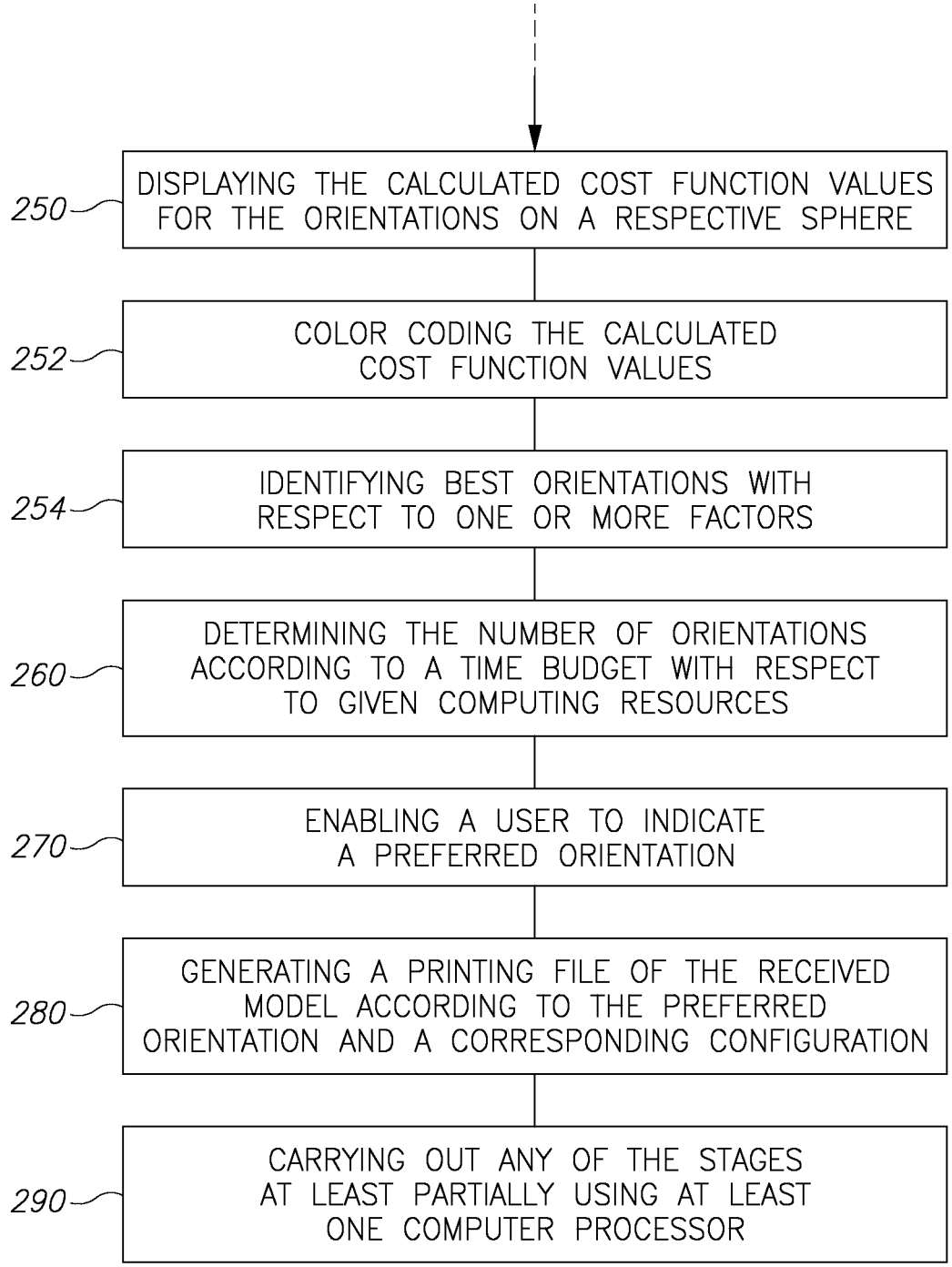
Figure 2 (cont. 1)

ORIENTATION OPTIMIZATION IN 3D PRINTING

CROSS-REFERENCE TO RELATED APPLICATIONS

This application is a National Phase Application of PCT International Application No. PCT/IL2015/050797, International Filing Date Aug. 3, 2015, claiming the benefit of U.S. Provisional Patent Application No. 62/087,262, filed Dec. 4, 2014, all of which are hereby incorporated by reference.

BACKGROUND OF THE INVENTION

1. Technical Field

The present invention relates to the field of three dimensional printing, and more particularly, to analyzing preferred orientations for 3D printing models.

2. Discussion of Related Art

Three dimensional printing (3D Printing, or 3DP) denotes a broad range of technologies for creating three-dimensional objects by applying material one layer after the other, according to specification given as a digital model. The field is often called additive manufacturing (AM) since material is added to the growing object (as opposed to subtractive methods such as NC machining). There are a variety of technologies that fall under this category, but most of them share the characteristics that the desired object is produced layer by layer. Slicing tools comprise software that converts a model file into printing instructions for producing the actual objects, as surveyed e.g., in Bugdayci et al. 2014 (Analysis of Slicing-Tools for Fused Deposition Modeling 3D-Printers and comparison of different printers, University of Stuttgart, Faculty of Computer Science, Electrical Engineering, and Information Technology, Student Report Software Engineering No. 191), which is incorporated herein by reference in its entirety. WIPO Publication No. 2014/141273, which is incorporated herein by reference in its entirety, discloses methods for slicing a three-dimensional model for printing of a corresponding object by a 3D printer.

SUMMARY OF THE INVENTION

The following is a simplified summary providing an initial understanding of the invention. The summary does not necessarily identify key elements nor limit the scope of the invention, but merely serves as an introduction to the following description.

One aspect of the present invention provides a method comprising selecting a plurality of orientations for a received model file, calculating received cost parameters for pairs of an orientation and one of received configurations, calculating for each orientation, a cost function value by weighting the calculated cost parameters according to the configurations, and displaying the calculated cost function values for the orientations on a respective sphere.

These, additional, and/or other aspects and/or advantages of the present invention are set forth in the detailed description which follows; possibly inferable from the detailed description; and/or learnable by practice of the present invention.

BRIEF DESCRIPTION OF THE DRAWINGS

For a better understanding of embodiments of the invention and to show how the same may be carried into effect, reference will now be made, purely by way of example, to the accompanying drawings in which like numerals designate corresponding elements or sections throughout.

In the accompanying drawings.

DETAILED DESCRIPTION OF THE INVENTION

Figure 1:
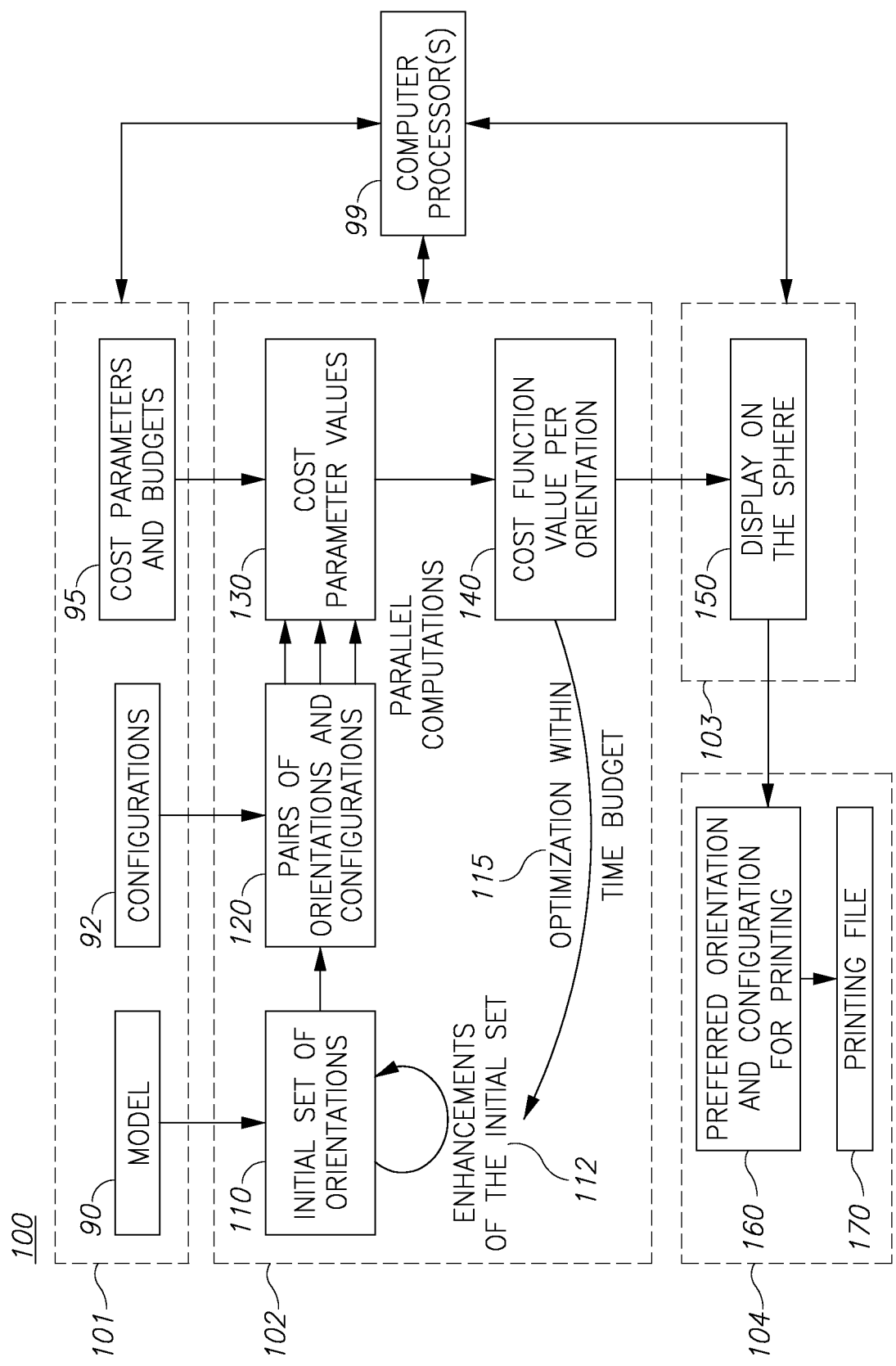
FIG. 1 is a high level schematic block diagram of a system, according to some embodiments of the invention.

Prior to the detailed description being set forth, it may be helpful to set forth definitions of certain terms that will be used hereinafter.

The term "model" as used in this application refers to a digital specification of a three-dimensional object, given to the system in a standard format such as a .stl file. It is noted that the input model file and the output printing file may be in any format, and .stl is used in the following merely as a non-limiting example.

The term "configuration" as used in this application refers to a pair of a printer type and a parameter setup as required for that printer, parameters may include for example a layer height, a printbed temperature, a support density, a support pattern, and more.

The term "orientation" as used in this application refers to a specification of two parameters that determine how the z-axis of the input model should be inclined in space for printing. In a non-limiting example, the latitude and longitude of a point p on a sphere (see below) may be used to determine an orientation in the following manner: the z-axis of the input model may be placed to be directed from the center of the sphere (or the origin) towards p. In general an orientation in three-dimensional space requires three parameters. For the sake of simplicity and clarity, and without limiting the scope of the disclosure, the rotation of the model around the inclined z-axis may be left arbitrary and hence allow discussing only two orientation parameters in some embodiments. In certain embodiments, in which this rotation is significant for the printing process however, three parameters may be used to specify each orientation.

The term "printbed" as used in this application refers to a part of the printing machine, namely the platform from which the object is grown (printed) in three dimensional printing (3DP). When the user selects a desired orientation q in the disclosed system, it generates a .stl file of the object with the z-axis of the input model inclined in the orientation q. The system may then apply a final transformation T to the rotated object, where the term "final transformation" as used in this application refers to a rigid transformation to be applied to the rotated object at the final step before producing the output model file. The final transformation is typically a translation along the z-axis creating a desired offset between the rotated model and the printbed. By default, this is the identity transformation that leaves the rotated object as-is.

The term "cost" as used in this application refers to a measure described by a single real number. It could be indeed directly related to a cost of a printing process, like the mass of the required printing material, or the time it takes to print the model, but it could also pertain to any other criterion, or a weighted combination of criteria (in the latter case, at an intersection of the Printing Statistics (PS, see below) of all the selected configurations).

The terms "printing statistics (PS)" or "cost parameters" as used in this application refer to the information produced per single given orientation, for one specific configuration, which also defines parameters that may have a cost. PS or parameters may be, as non-limiting examples, an expected printing time, a mass of required material or materials, a number of nozzle toggles (on/off), a volume of support material, a mass of support material and so forth.

The term "printing statistics generator (PSG)" as used in this application refers to the software procedure that computes the printing statistics for a given (rotated) model. This could be an internal module or a module supplied by the printer vendor or publicly available software.

The term "orientation set" as used in this application refers to a discrete or at least partly continuous collection of orientations. For example a set of candidate printing orientations that the user wishes to examine for cost. These could be vertices of some kind of a grid on the sphere, or orientations that are induced by the object, such as normals to the facets of the convex hull of the object.

The term "orientation map" as used in this application refers to a representation of all possible orientations as a sphere in the three-dimensional space. The sphere is the boundary of a ball in three-dimensional space.

The terms "sphere of directions" or "sphere" as used in this application refer to the unit sphere $S^2$ in $\mathbb{R}$ used by the algorithm and visualization to describe the space of all possible directions in the three-dimensional space. The sphere of directions is one of several synonymous or closely related terms—other are normal diagram, Gaussian map, and more. A point p on the sphere of directions represents the direction from the center of the sphere towards p. The term "sphere" may refer to both a computational concept, on which e.g., the Delaunay triangulation is constructed (see below) as well as to a visualization concept, used to illustrate the cost parameters of different orientations. In the latter case, for presentation purposes, the sphere may be scaled, colored, encompass the entire model or modified to represent the orientation map and associated costs. In certain cases, the orientations may be represented on a form other than a sphere, such as on an ellipsoid, or as the drawing of a graph of a bivariate function defined over the sphere.

The term "cost color-palette" as used in this application refers to a parameterizable scale between two colors: one extreme stands for the best (lowest) possible cost and the other extreme of the color scale stands for the highest cost. The cost color-palette is used to indicate costs, e.g., on a sphere displayed on the user interface and denoting all possible model orientations.

The term "Delaunay triangulation of the sphere" as used in this application refers to a covering of the sphere by pairwise interior-disjoint spherical triangles whose corners are points of a finite set P of points on the sphere (termed Delaunay Triangulation of P on the sphere, see e.g., FIG. 3B below). It is noted that a spherical triangle is a region on the surface of a sphere bounded by three geodesic arcs intersecting pairwise in three vertices. Delaunay triangulations have the property that the circle that passes through the corners of a triangle does not contain other points of the triangulation in its interior. This typically leads to favorable properties of the Delaunay triangulation over arbitrary triangulations.

The term "density level" as used in this application refers to the number of spherical point samples used to produce the Delaunay triangulation. The density level may be carried throughout the process as the system may allow for progressively increasing the density level, as explained below.

With specific reference now to the drawings in detail, it is stressed that the particulars shown are by way of example and for purposes of illustrative discussion of the preferred embodiments of the present invention only, and are presented in the cause of providing what is believed to be the most useful and readily understood description of the principles and conceptual aspects of the invention. In this regard, no attempt is made to show structural details of the invention in more detail than is necessary for a fundamental understanding of the invention, the description taken with the drawings making apparent to those skilled in the art how the several forms of the invention may be embodied in practice.

Before at least one embodiment of the invention is explained in detail, it is to be understood that the invention is not limited in its application to the details of construction and the arrangement of the components set forth in the following description or illustrated in the drawings. The invention is applicable to other embodiments or of being practiced or carried out in various ways. Also, it is to be understood that the phraseology and terminology employed herein is for the purpose of description and should not be regarded as limiting.

While at a very high level the 3DP process may seem similar across the different technologies, the differences become huge when considering the details of the printing process. For example, one of the factors by which technologies differ is the need for support material. Since the object is printed layer after layer, a problem arises when a feature of the object starts at an advanced layer with no material put below it. Such a feature is called an overhang. Certain printing technologies, like Fused Deposition Modeling (FDM), necessitate that there is some support structure below the overhang. This in turn requires extra material over the material required for the object itself. However, there are other 3DP technologies that do not necessarily require support material, as they sinter portions of a rug of powder that is spread over the entire (typically rectangular) area of the current layer. Selective Laser Sintering (SLS) is one such technology where support structure is not always needed. This example comes to show that there are significant disparities between the technologies. Even this seemingly clear-cut example has more subtleties than immediately meet the eye. Depending on quality requirements as well as on material properties one could recycle the un-sintered material in SLS. If the material cannot be recycled then the volume of the material that needs to considered in SLS could in fact be even greater than the volume of material that is needed in FDM for printing the same object. In the latter case hence, the support-material volume added to the volume of material of the base model is a cost parameter.

Next, even while using the same printer, one could configure the printer in a variety of ways. Each configuration results in a slightly differently printed object, possibly requiring a different amount of material and taking different time to print. Dwelling further on the support material example, one could fine-tune how dense the support structure is, which immediately affects the two factors just mentioned: volume of material and printing time.

The focus in the present disclosure is on 3DP technologies in which an object grows vertically from a horizontal printbed. A critical decision is how to place the object on the printbed, namely in what position and orientation to place it. The choice of orientation is critical since it can affect the printing time, the volume of material to be used, the smoothness of the object surface, the effort required to post process the object and more. For example, Alexander et al. (Part orientation and build cost determination in layered manufacturing, Computer-Aided Design, 30(5):343-356, 1998) provide a detailed discussion on the importance of the choice of orientation in 3DP, and Umetani and Schmidt (Cross-sectional structural analysis for 3D printing optimization, ACM SIGGRAPH Asia 2013 Technical brief 2013) discuss the effect of orientation on structural strength.

Systems and methods are provided, in which an input module receives a model file, configuration(s) and cost parameters, and a processing unit selects and updates orientation sets for the model, and calculates the received cost parameters for pairs of orientation and configuration. Methods are provided for improving 3D printing by determining a preferred combination of printer, printer-setup, and orientation for a 3D object to be printed which minimizes a cost function relating e.g., the volume of material used and the printing time. Determining orientation sets may be carried out on a Gaussian sphere by constructing a Delaunay triangulation of the points of the orientation sets on the sphere. Systems and methods calculate for each orientation, a cost function value by weighting the calculated cost parameters according to the configuration(s) and display the calculated cost function values for the orientations on a respective sphere in a user interface. The methods may be executed on many processors, e.g., hundreds of processors, or on multi-core computer(s) and may use a NoSQL database (e.g., mongoDB) to transfer data among processes, as well as to store intermediate computing results. The sphere may be colored according to the cost function values, the orientation set may be enhanced and costs may be recalculated according to the cost function, and various information and statistics may be presented on the sphere. The coloring of the sphere may comprise assigning color gradients to denote the gradual change of the cost function values. One or more colors and/or color gradients may be used to denote respective one or more cost functions. Finally, a selected orientation may be used to define the recommended or user-selected printing configuration and parameters, and a final printing file with the model at the selected orientation may be output at any 3DP format. Systems include a visual interactive system for recommending the users of 3D printing technologies on what printer, with what printer configuration, and in what orientation of a given object it would be best (or preferred) to print the object. The recommendation is determined by a combination of criteria with weights given by the users through a graphical dashboard. Massive parallelization of the computational processes may be used to overcome the immense computational demands of the disclosed systems and methods, to provide an efficiently responsive system.

FIG. 1 is a high level schematic block diagram of a system 100, according to some embodiments of the invention. System 100 may comprise an input module 101, a processing unit 102, a graphical user interface (GUI) 103 and optionally an output module 104; and be at least partially implemented using one or more computer processors 99.

Input module 101 may be configured to receive a model file 90, at least one configuration 92 and cost parameters possibly with specified budgets 95 from a user. Inputs may comprise model file 90 in .stl format or similar, e.g., dragged and dropped into GUI 103, e.g., on a web-browser; one or more configuration files 92; optimization criteria to be considered (e.g., as cost parameters and budgets 95), which constitute a subset of the printing statistics parameters. Optionally, additional input may comprise relative weights of the different optimization criteria (cost parameters 95), e.g., set through GUI 103 using sliding bars; constraints on allowable orientations; suggested initial set of orientations 110; and/or a time budget (e.g., in milliseconds), a money budget the user is willing to invest in the optimization process etc., the latter may be internally translated into terms of a time budget. In certain embodiments, model file 90 may be analyzed as a preparatory step, e.g., with regard to its geometrical parameters, required mechanical properties and production specifications, and the analysis results may be used to select or refine the selection of the orientations.

Processing unit 102 may be configured to calculate received cost parameters for pairs of a selected orientation and one of the at least one configuration 120, and calculate for each orientation, a cost function value 140 by weighting the calculated cost parameters according to the at least one configuration. Cost parameter values 130 may be calculated for each pair 120 at least partially in parallel, using multiple processors 99. Processing unit 102 may be further configured to select an initial set of orientations 110 for the received model file and enhance 112 the initial set with additional orientations selected according to at least one of a face area in a Delaunay triangulation according to the initial orientations and a derivative of the cost function. Processing unit 102 may possibly determine a number of orientations according to a time budget with respect to given computing resources 115. In certain embodiments, the change in the cost parameters and/or the cost function values may be extrapolated and/or interpolated along at least parts of the sphere (e.g., over some of the spherical triangles of the Delaunay triangulation).

Graphical user interface 103 may be configured to display the calculated cost function values for the orientations on a respective sphere 150. GUI 103 may be further configured to color code the calculated cost function values on displayed sphere 150, identify at least one preferred orientation with respect to the received cost parameters and enable a user to rotate displayed sphere 150 and indicate a preferred orientation 160. Output module 104 may be configured to provide a printing file 170 of the received model according to preferred orientation 160 and a corresponding configuration. In certain embodiments, the orientations may be compared with respect to multiple cost parameters or metrics related thereto, and different comparisons may be applied in different orientations to express different requirements from the produced model, such as requirements related to mechanical strength, to quality of surface finish, to support material etc.

Outputs of system 100 may comprise color-coded spherical orientation map 150 around model 90 (see, as non-limiting examples, FIGS. 3A-3D and 4A-4D below), where each point on sphere 150 represents an orientation for putting model 90 on the printbed—the orientation with which the original z-axis of model 90 should be aligned in order to obtain the color-coded cost. In certain embodiments, certain orientations may be highlighted according to their respective cost function values, e.g., one or more preferred (or best) orientations (possibly with respect to optimizations of different parameters), one or more unfavorable (or worst) orientations, and input orientation etc. (see, e.g., FIGS. 3C and 4A). Certain regions on sphere 150 may be indicated as being more sensitive to minor changes or to process issues than other, while certain regions may be indicated as being less sensitive to exact positioning parameters and process variations. GUI 104 may be configured to enable the user click on sphere 150 or on certain regions of sphere 150 to receive specific cost data for any orientation and/or configuration and/or add any specific highlighting of further orientations along with respective data. Output module 104 may be configured to generate a .stl file with the model in a user selected orientation and according to a specified configuration, with the final transformation applied to it after rotation.

In certain embodiments, internal parameters such as a density level of the initial map (reflecting initial set of orientations 110), a number of available processors 99, the cost color-palette and a final transformation T (being a rigid transformation applied to the rotated object at the final step before producing the output model file) may also be input by certain users.

It is noted that in some embodiments, the rotation of the model around the inclined z-axis may be left arbitrary and hence allow discussing only two orientation parameters. For example, this may be the case when, along a given plane, the printing process behaves the same everywhere. In certain embodiments, in which this rotation is significant for the printing process, three parameters may be used to specify each orientation. For example, when distinct directions that are parallel to the printbed behave differently, a more complex internal and visual representation may be required, which may be provided on the basis of the present disclosure.

Figure 2:
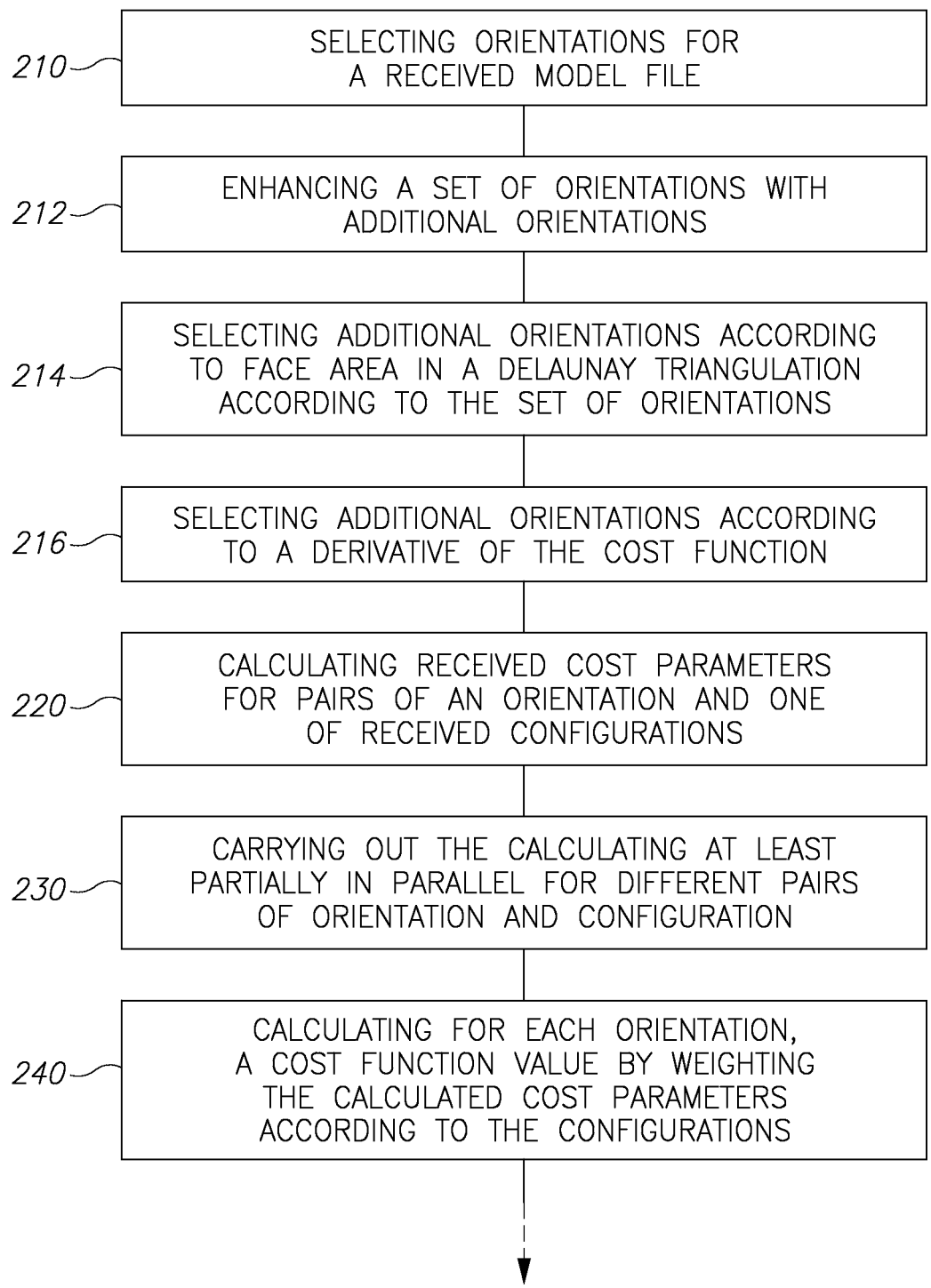
FIG. 2 is a high level schematic flowchart of a method, according to some embodiments of the invention.

FIG. 2 is a high level schematic flowchart of a method 200, according to some embodiments of the invention. Any of the stages of method 200 may be carried out at least partially by at least one computer processor (stage 290), e.g., by computer processor(s) 99. Certain embodiments comprise a computer program product comprising a computer readable storage medium having computer readable program embodied therewith and configured to carry out any of the stages of method 200.

Figure 3A:
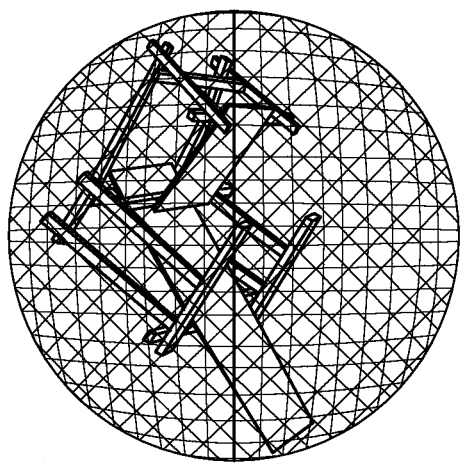
FIGS. 3A-3D and 4A-4D illustrate and exemplify the method and the estimation of different orientations on the sphere, as carried out on different objects, according to some embodiments of the invention.
Figure 3B:
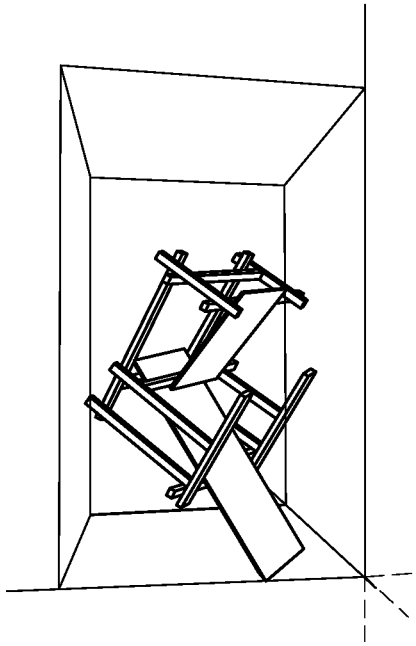
Figure 3C:
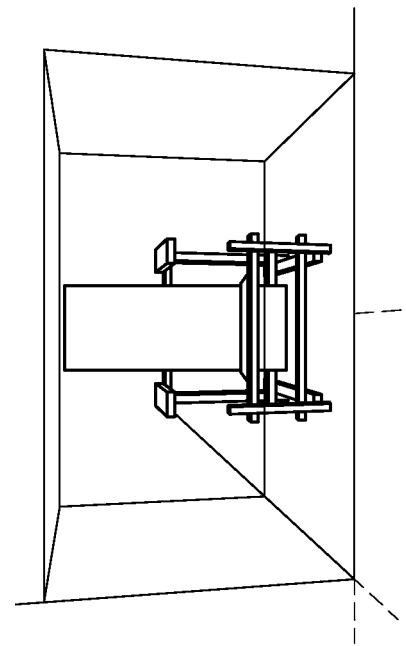
Figure 3D:
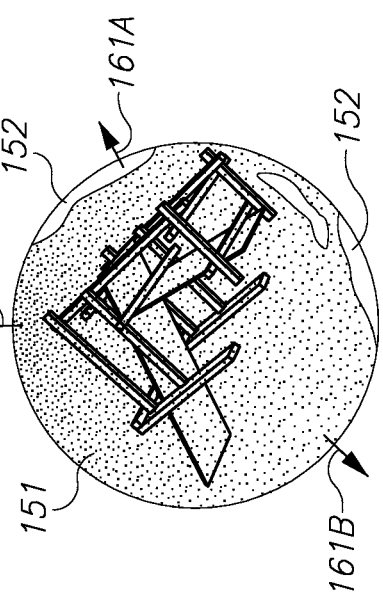
Figure 4B:
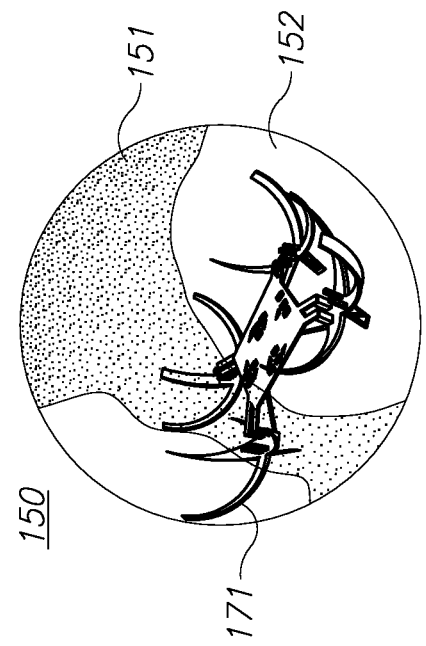
Figure 4D:
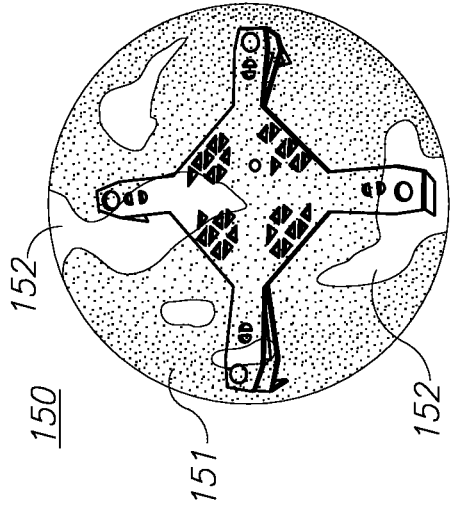
Figure 4A:
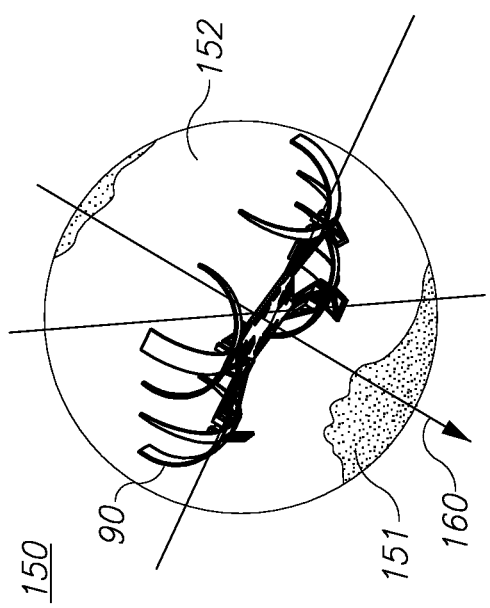
Figure 4C:
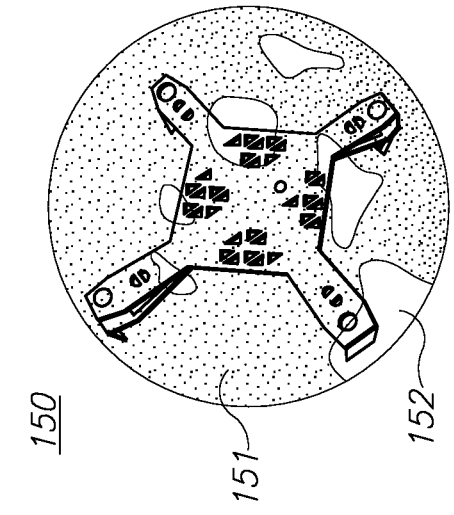

FIGS. 3A-3D and 4A-4D illustrate and exemplify method 200 and the estimation of different orientations on the sphere, as carried out on different objects, according to some embodiments of the invention. FIGS. 3A-3D and 4A-4D are used in the following to demonstrate in a non-limiting manner the operation of method 200 and of system 100. It is noted that FIGS. 3B, 3C and 4A-4D are to be understood as representing respective spheres that encompass the illustrated models. It is further noted that the coloring of the sphere's surface in FIGS. 3C and 4A-4D is represented schematically by regions 151, 152, generally denoting favorable directions 151 on sphere 150 and unfavorable directions 152 on sphere 150. However in actuality, the coloring of the sphere's surface may be continuous (i.e., represent color gradients) and represent more exact values of merit of the corresponding orientations. The coloring of the sphere's surface may be discrete with respect to either or both the sphere's surface and the range of colors, and employ any number of colors, any color gradients and any density of points, depending on the budget requirements and analysis results. Hence, the illustrated representations are not to be understood as limiting the invention in these respects. FIG. 3A illustrates model 90, FIG. 3B illustrates a Delaunay diagram 114 of a set of orientations of the model (the depicted Delaunay diagram comprises, in a non-limiting manner, a degenerate triangulation as its vertices are aligned along a relatively small number of latitudes and longitudes, however, it is understood to represent any Delaunay triangulation), FIG. 3C illustrates sphere 150 of orientations with indicated best (160), worst (161A) and initial (161B) orientations (see explanation below) and FIG. 3D illustrates an optimized orientation for the model 171. FIGS. 4A-4D illustrate different views of sphere 150 for different models (FIGS. 4A and 4B illustrate one model, FIGS. 4C and 4D illustrate another model), with low cost orientations indicated in hatching 151 and high cost orientations indicated in non-hatched 152.

Method 200 may comprise selecting a plurality of orientations for a received model file (stage 210), calculating received cost parameters for pairs of an orientation and one of received configurations (stage 220), calculating for each orientation, a cost function value by weighting the calculated cost parameters according to the configurations (stage 240), and displaying the calculated cost function values for the orientations on a respective sphere (stage 250).

Method 200 may further comprise enhancing a set of orientations (e.g., an initial set or a current set) with additional orientations (stage 212) selected according to a face area in a Delaunay triangulation according to the set of orientations (stage 214) and/or according to a derivative of the cost function (stage 216). Method 200 may comprise determining a number of orientations according to a time budget with respect to given computing resources (stage 260).

In certain embodiments, the following determines the growth process 112 of the orientation set. As a starting point, the two optional input parameters pertaining to the orientation set may be used—allowable orientations and suggested orientation set. Initial orientation set Q 110 may be created to comply with these two input parameters together with an internal parameter that fixes the density level of the first set. If the current number of samples is smaller than the prescribed initial density level, additional orientations may be added to Q using the following procedure add_orientations (Q, m), where m is the number of extra orientations that can be added. The procedure add_orientations (Q, m) may start with the set Q 110 and add m more orientations to create a larger set 112, which is still denoted by Q (Q being a container of orientations). The procedure may enhance Q following the input rules for allowable orientations given by the two optional parameters, the directions of the normals of the convex hull faces and properties of faces of the Delaunay diagram 114 of the set Q (see e.g., FIG. 3B). The area of the faces of Delaunay triangulation 114 may be used to bias the sampling in order to sample with higher probability on larger faces. The sampling may also be biased toward regions having a higher derivative of the cost function, i.e., the cost changes more per slight changes of orientation than in other regions, or be biased to user-specified regions. Depending on the time budget, system 100 and method 200 may switch from sampling to analysis to detect candidates for best orientation. The pairs of orientation and configuration may be created as the Cartesian product of Q and a set C of given configurations. The set of pairs is denoted by $S:=\{(q,c)|q \in Q, c \in C\}$.

In certain embodiments, calculating the cost parameters 220 may be carried out at least partially in parallel for different pairs of orientation and configuration (stage 230). The main process may spawn parallel processes based on the number of processors 99 available. Each spawned process gets one or more pairs from S. For each pair (q, c), it rotates input model 90 into orientation q, applies the final transformation T to the rotated model, runs the PSG (Printing Statistics Generator, see above) suitable for c on the resulting model, and relays the statistics back to the main process. For each orientation $q \in Q$, the weighted cost is calculated for all pairs having q as their orientation and the best one is taken as the cost of the orientation q. Delaunay triangulation 114 of the points in Q is constructed and presented on the sphere.

Method 200 may further comprise any of color coding the calculated cost function values on the displayed sphere (stage 252), identifying at least one preferred orientation with respect to the received cost parameters (stage 254) and/or enabling a user to indicate a preferred orientation (stage 270). Method 200 may then comprise generating a printing file of the received model according to the preferred orientation and a corresponding configuration (stage 280).

The color map may be created by interpolation of costs using Delaunay triangulation 114 and the translation of costs into colors using the cost color-palette. In certain circumstances (like having a low initial density level), this requires a tremendously larger set of samples than Q. The color of each point in the extended set may be computed to obtain a much more refined triangulation of the sphere, which may then be colored smoothly. Given additional time, additional orientation-configuration pairs may be handled within the time budget. For example, for n additional pairs, additional m orientations may be added (m=n/|C|, i.e., n divided by the number of configurations) according to the procedure presented above.

In the above description, an embodiment is an example or implementation of the invention. The various appearances of "one embodiment", "an embodiment", "certain embodiments" or "some embodiments" do not necessarily all refer to the same embodiments.

Although various features of the invention may be described in the context of a single embodiment, the features may also be provided separately or in any suitable combination. Conversely, although the invention may be described herein in the context of separate embodiments for clarity, the invention may also be implemented in a single embodiment.

Certain embodiments of the invention may include features from different embodiments disclosed above, and certain embodiments may incorporate elements from other embodiments disclosed above. The disclosure of elements of the invention in the context of a specific embodiment is not to be taken as limiting their use in the specific embodiment alone.

Furthermore, it is to be understood that the invention can be carried out or practiced in various ways and that the invention can be implemented in certain embodiments other than the ones outlined in the description above.

The invention is not limited to those diagrams or to the corresponding descriptions. For example, flow need not move through each illustrated box or state, or in exactly the same order as illustrated and described.

Meanings of technical and scientific terms used herein are to be commonly understood as by one of ordinary skill in the art to which the invention belongs, unless otherwise defined.

While the invention has been described with respect to a limited number of embodiments, these should not be construed as limitations on the scope of the invention, but rather as exemplifications of some of the preferred embodiments. Other possible variations, modifications, and applications are also within the scope of the invention. Accordingly, the scope of the invention should not be limited by what has thus far been described, but by the appended claims and their legal equivalents.

What is claimed is:

1. A method comprising:
   selecting a plurality of orientations for a received model file,
   calculating received cost parameters for pairs of an orientation and one of received configurations,
   calculating for each orientation, a cost function value by weighting the calculated cost parameters according to the configurations, and
   displaying the calculated cost function values for the orientations on a respective sphere,
   enhancing a set of orientations with additional orientations selected according to at least one of: a face area in a Delaunay triangulation according to the set of orientations, and a derivative of the cost function, and
   printing a three-dimensional object of the received model based on a preferred orientation,
   wherein at least one of: the selecting, the calculating and the displaying is carried out by at least one computer processor.

2. The method of claim 1, further comprising determining a number of orientations according to a time budget with respect to given computing resources.

3. The method of claim 1, wherein the calculating of the cost parameters is carried out at least partially in parallel for different pairs of orientation and configuration.

4. The method of claim 1, further comprising color coding the calculated cost function values on the displayed sphere.

5. The method of claim 1, further comprising identifying at least one preferred orientation with respect to the received cost parameters.

6. The method of claim 1, further comprising enabling a user to indicate a preferred orientation and generating a printing file of the received model according to the preferred orientation and a corresponding configuration.

7. A computer program product comprising a non-transitory computer readable storage medium having computer readable program embodied therewith and configured to carry out the method of claim 1.

8. A system comprising:
   an input module configured to receive a model file, at least one configuration and cost parameters,
   a processing unit configured to calculate received cost parameters for pairs of a selected orientation and one of the at least one configuration, and calculate for each orientation, a cost function value by weighting the calculated cost parameters according to the at least one configuration,
   wherein the processing unit is further configured to select an initial set of orientations for the received model file and enhance the initial set with additional orientations selected according to at least one of: a face area in a Delaunay triangulation according to the initial orientations, and a derivative of the cost function; wherein a number of orientations is determined according to a time budget with respect to given computing resources,
   a graphical user interface configured to display the calculated cost function values for the orientations on a respective sphere, and
   an output module configured to provide a printing file of the received model for printing a three-dimensional object of the received model based on a preferred orientation.

9. The system of claim 8, wherein the graphical user interface is further configured to color code the calculated cost function values on the displayed sphere, identify at least one preferred orientation with respect to the received cost parameters and enable a user to rotate the displayed sphere and indicate a preferred orientation.

10. The system of claim 8, wherein the output module is further configured to provide the printing file of the received model according to the preferred orientation and a corresponding configuration.

* * * * *